United States Patent
Gaku et al.

(10) Patent No.: US 6,750,422 B2
(45) Date of Patent: Jun. 15, 2004

(54) METHOD OF MAKING THROUGH HOLE WITH LASER, COPPER-CLAD LAMINATE SUITABLE FOR MAKING HOLE, AND AUXILIARY MATERIAL FOR MAKING HOLE

(75) Inventors: Morio Gaku, Tokyo (JP); Nobuyuki Ikeguchi, Tokyo (JP); Yasuo Tanaka, Tokyo (JP); Yoshihiro Kato, Tokyo (JP)

(73) Assignee: Mitsubishi Gas Chemical Company, Inc., Tokyo (JP)

(*) Notice: Subject to any disclaimer, the term of this patent is extended or adjusted under 35 U.S.C. 154(b) by 0 days.

(21) Appl. No.: 10/028,734

(22) Filed: Dec. 28, 2001

(65) Prior Publication Data

US 2002/0113044 A1 Aug. 22, 2002

Related U.S. Application Data

(62) Division of application No. 09/271,897, filed on Mar. 18, 1999, now Pat. No. 6,337,463.

(30) Foreign Application Priority Data

| | | |
|---|---|---|
| Mar. 18, 1998 | (JP) | 10-68357 |
| May 7, 1998 | (JP) | 10-140472 |
| May 12, 1998 | (JP) | 10-145205 |
| May 12, 1998 | (JP) | 10-145206 |
| May 29, 1998 | (JP) | 10-166324 |
| Jun. 1, 1998 | (JP) | 10-167759 |
| Jun. 1, 1998 | (JP) | 10-167760 |
| Jul. 15, 1998 | (JP) | 10-216411 |
| Aug. 20, 1998 | (JP) | 10-250447 |

(51) Int. Cl.$^7$ ............................................. B23K 26/00
(52) U.S. Cl. ........................... 219/121.69; 219/121.7
(58) Field of Search .................. 219/121.69, 121.67, 219/121.68, 121.7, 121.71, 121.85

(56) References Cited

U.S. PATENT DOCUMENTS

| | | | | |
|---|---|---|---|---|
| 4,751,146 A | * | 6/1988 | Maeda et al. | 428/475.8 |
| 5,470,644 A | * | 11/1995 | Durant | 428/209 |
| 5,847,327 A | * | 12/1998 | Fischer et al. | 174/258 |
| 5,863,446 A | * | 1/1999 | Hanson | 216/16 |
| 5,916,401 A | * | 6/1999 | Gannon | 156/240 |
| 5,925,500 A | * | 7/1999 | Yang et al. | 430/300 |
| 5,965,043 A | | 10/1999 | Noddin et al. | |

FOREIGN PATENT DOCUMENTS

| | | |
|---|---|---|
| JP | 48914 | 2/1999 |
| WO | 98/20533 | 5/1998 |

* cited by examiner

*Primary Examiner*—M. Alexandra Elve
(74) *Attorney, Agent, or Firm*—Wenderoth, Lind & Ponack, LLP

(57) ABSTRACT

A method of making a small-diameter through hole having high reliability with regard to a hole wall at a high rate with the energy of a high-output carbon dioxide gas laser without pre-making any hole in a copper foil, forming or disposing a coating or a sheet of an organic substance containing 3 to 97% by volume of at least one powder selected from the group consisting of a metal compound powder, a carbon powder and metal powder which have a melting point of at least 900° C. and a bond energy of at least 300 KJ/mol on at least a copper foil surface to be irradiated with the carbon dioxide gas laser, and irradiating a surface thereof with necessary pulses of the carbon dioxide gas laser to form the penetration hole, and an auxiliary material for use when a penetration hole is made in the copper-clad laminate with a carbon dioxide gas laser, the auxiliary material being a coating or a sheet of an organic substance containing 3 to 97% by volume of at least one powder selected from the group consisting of a metal compound powder, a carbon powder and metal powder which have a melting point of at least 900° C. and a bond energy of at least 300 KJ/mol.

6 Claims, 3 Drawing Sheets

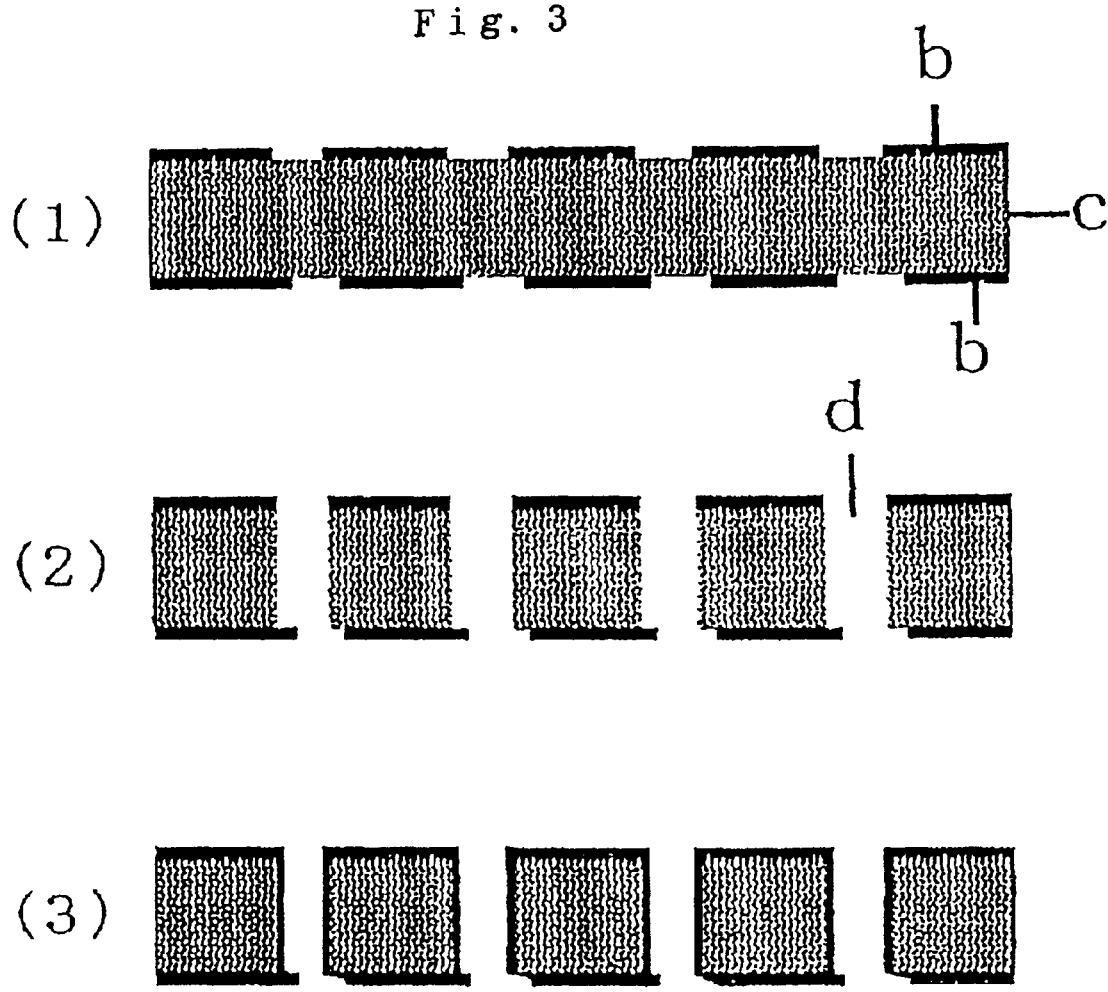

US 6,750,422 B2

METHOD OF MAKING THROUGH HOLE WITH LASER, COPPER-CLAD LAMINATE SUITABLE FOR MAKING HOLE, AND AUXILIARY MATERIAL FOR MAKING HOLE

This is a divisional application of Ser. No. 09/271,897, filed Mar. 18, 1999, now U.S. Pat. No. 6,337,463.

BACKGROUND OF THE INVENTION

1. Field of the Invention

The present invention relates to a method of making a through hole in a copper-clad laminate having at least two copper layers with a carbon dioxide gas laser. More specifically, it relates to a method of making a through hole by directly irradiating a copper-clad laminate surface with the energy of a high-output carbon dioxide gas laser without the pre-removal of a surface copper foil by etching. A printed wiring board to which the above copper-clad laminate having the through hole made above is applied is used mainly for a small-sized semiconductor plastic package.

2. Prior Art of the Invention

In a high-density printed wiring board used for a semiconductor plastic package, etc., a through hole is conventionally made wish a drill. In recent years, the through hole diameter is decreasing to 0.15 mm or less, and the diameter of the drill is therefore decreasing. When a hole having the above small diameter is made, the problem is that the drill bents or breaks or that the processing speed is low, due to the small diameter of the drill, which results in problems in productivity and reliability.

Further, in a high-density printed wiring board, the width and space of a circuit are sharply decreasing, and in some printed wiring boards, the line/space is 100 µm/100 µm or less. In this case, a pattern breakage or a short circuit often occurs, and low yields are caused.

Further, when there is employed a method in which holes having the same size are made in copper foils on upper and lower surfaces through negative films according to a predetermined method and a through hole reaching the upper and lower surfaces with a carbon dioxide gas laser, the problem is that the positions of the holes on the upper and lower surfaces deviate from each other so that it is difficult to form a land. Further, for making a hole through a copper foil on a reverse surface by irradiating the reverse surface with a carbon dioxide gas laser, a high-output energy is required. Therefore, the laser is confined to a metal sheet by placing the metal sheet on the reverse side. Even in this case, when the metal sheet has gloss, laser beam is reflected to hit the reverse surface of a copper-clad laminate, which causes a defect. Moreover, it has been impossible to make a hole in a plurality of copper-clad laminates at the same time.

A copper-clad laminate formed of a glass cloth substrate and a thermosetting resin has the following problems. When a through hole is made therein with a low-output carbon dioxide gas laser, it is difficult to process the glass and the hole wall is fluffed, or when the output of the carbon dioxide gas laser is high, the hole wall is not straightly formed and deformed. Further, when the copper foil is directly irradiated with a carbon dioxide gas laser, the laser is reflected and no hole can be made.

SUMMARY OF THE INVENTION

It is an object of the present invention to provide a method of making a small-diameter hole having high reliability with regard to a hole wall at a high rate with the energy of a high-output carbon dioxide gas laser without pre-making any hole in a copper foil.

It is another object of the present invention to provide a method of making small-diameter holes having high reliability with regard to a hole wall in a plurality of stacked copper-clad laminates at a high rate with the energy of a high-output carbon dioxide gas laser without pre-making any hole in copper foils.

It is further another object of the present invention to provide a copper-clad laminate suitable for making a hole with a high-output carbon dioxide gas laser.

It is still further another object of the present invention to provide an auxiliary material which enables the easy formation of a highly reliable hole with a carbon dioxide gas laser when brought into intimate contact to a copper foil surface to be directly irradiated with a carbon dioxide gas laser.

It is yet another object of the present invention to provide a backup sheet which enables the easy formation of a highly reliable hole with a carbon dioxide gas laser.

According to the present invention, there is provided a method of forming a penetration hole for a through hole in a thermosetting resin copper-clad laminate having at least two copper layers, in which copper foils of the thermosetting resin copper-clad laminate are processed with an energy of 20 to 60 mJ/pulse sufficient for removing the copper foils by means of the pulse oscillation of a carbon dioxide gas laser, the method comprising forming or disposing a coating or a sheet of an organic substance containing 3 to 97% by volume of at least one powder selected from the group consisting of a metal compound powder, a carbon powder and metal powder which have a melting point of at least 900° C. and a bond energy of at least 300 KJ/mol on at least a copper foil surface to be irradiated with the carbon dioxide gas laser, and irradiating a surface thereof with necessary pulses of the carbon dioxide gas laser to form the penetration hole.

According to the present invention, there is also provided a method of making a penetration hole for a through hole according to the above, wherein, after the penetration hole is formed, both the copper foil surfaces are etched to remove part of the thickness thereof and form a smooth surface and at the same time to remove copper foil burrs fluffing on a penetration hole portion.

According to the present invention, there is also provided a method of making penetration holes according to the above, wherein coatings or sheets of an organic substance containing 3 to 97% by volume of at least one powder selected from the group consisting of a metal compound powder having a melting point of at least 900° C. and a bond energy of at least 300 KJ/mol, a carbon powder and metal powder are formed or disposed on copper foil surfaces of 2 to 10 copper-clad laminates, one coating or sheet on the copper foil surface of one copper-clad laminate, the 2 to 10 copper-clad laminates are stacked, and the upper surface of the stacked copper-clad laminates is irradiated with the carbon dioxide gas laser to form the penetration holes at the same time.

According to the present invention, there is also provided a copper-clad laminate for use in a method of forming a penetration hole for a through hole in a thermosetting resin copper-clad laminate having at least two copper layers, in which copper foils of the thermosetting resin copper-clad laminate are processed with an energy of 20 to 60 mJ/pulse sufficient for removing the copper foils by means of the pulse oscillation of a carbon dioxide gas laser, the copper-clad laminate being a copper-clad laminate containing a prepreg of a glass fabric substrate which is impregnated with a resin composition containing a thermosetting resin having a glass transition temperature of at least 150° C. and 10 to 60% by weight an insulating inorganic filler, the copper-clad laminate having a cross section wherein the thermosetting resin and the inorganic filler from the resin composition are homogeneously mixed.

According to the present invention, there is provided an auxiliary material which is for use on a copper foil surface of a copper-clad laminate when a penetration hole is made in the copper-clad laminate with a carbon dioxide gas laser by irradiating the copper foil surface with an energy of 20 to 60 mJ/pulse sufficient by means of the pulse oscillation of a carbon dioxide gas laser, and which is a coating or a sheet of an organic substance containing 3 to 97% by volume of at least one powder selected from the group consisting of a metal compound powder, a carbon powder and metal powder which have a melting point of at least 900° C. and a bond energy of at least 300 KJ/mol.

According to the present invention, there is also provided a backup sheet for making a hole with a carbon dioxide gas laser, which is for use on a reverse outermost copper foil surface of a copper-clad laminate when a hole is made in the copper-clad laminate with a carbon dioxide gas laser by irradiating a front copper foil surface with an energy of 20 to 60 mJ/pulse by means of the pulse oscillation of a carbon dioxide gas laser and which comprises a 20 to 200 μm thick resin layer and a metal plate.

BRIEF DESCRIPTION OF DRAWINGS

FIG. 3 shows the steps of making penetration holes for through holes in Comparative Example 5, in which (1) shows the step of removing copper foil by etching, (2) shows the step of making holes, and (3) shows the step of copper plating.

DETAILED DESCRIPTION OF THE INVENTION

Figure 1:
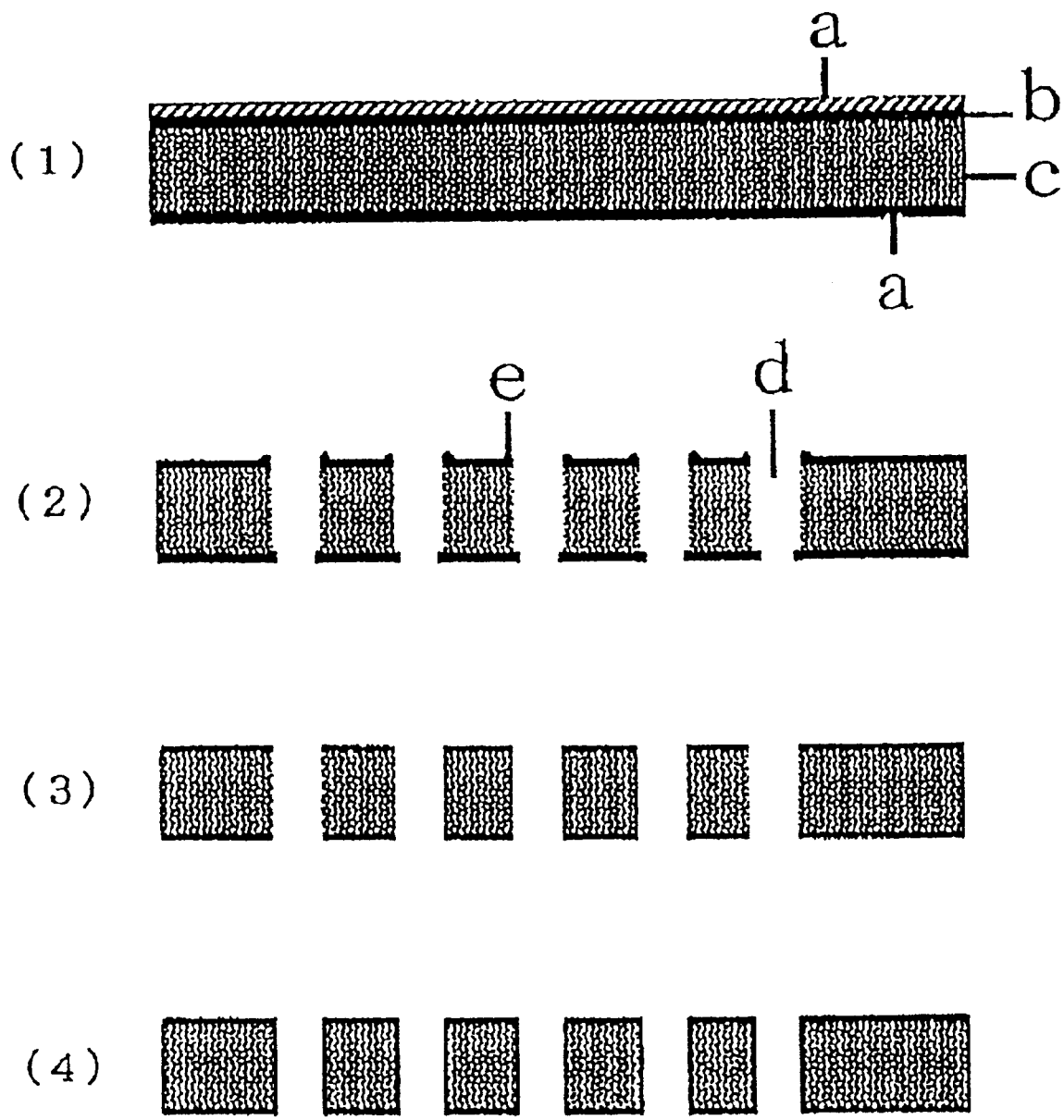
FIG. 1 shows the steps of making penetration holes for through holes with a carbon dioxide gas laser in Examples 1 and 2, in which (1) shows the step of forming a coating of a resin containing a metal compound, (2) shows the step of making holes and removing the coating, (3) shows the step of etching the entire surface of each copper foil of a copper-clad laminate to remove part of the thickness thereof (SUEP: surface uniform etching process), to remove copper foil burrs around holes and dissolve the copper foils and (4) shows the step of copper plating.
Figure 2:
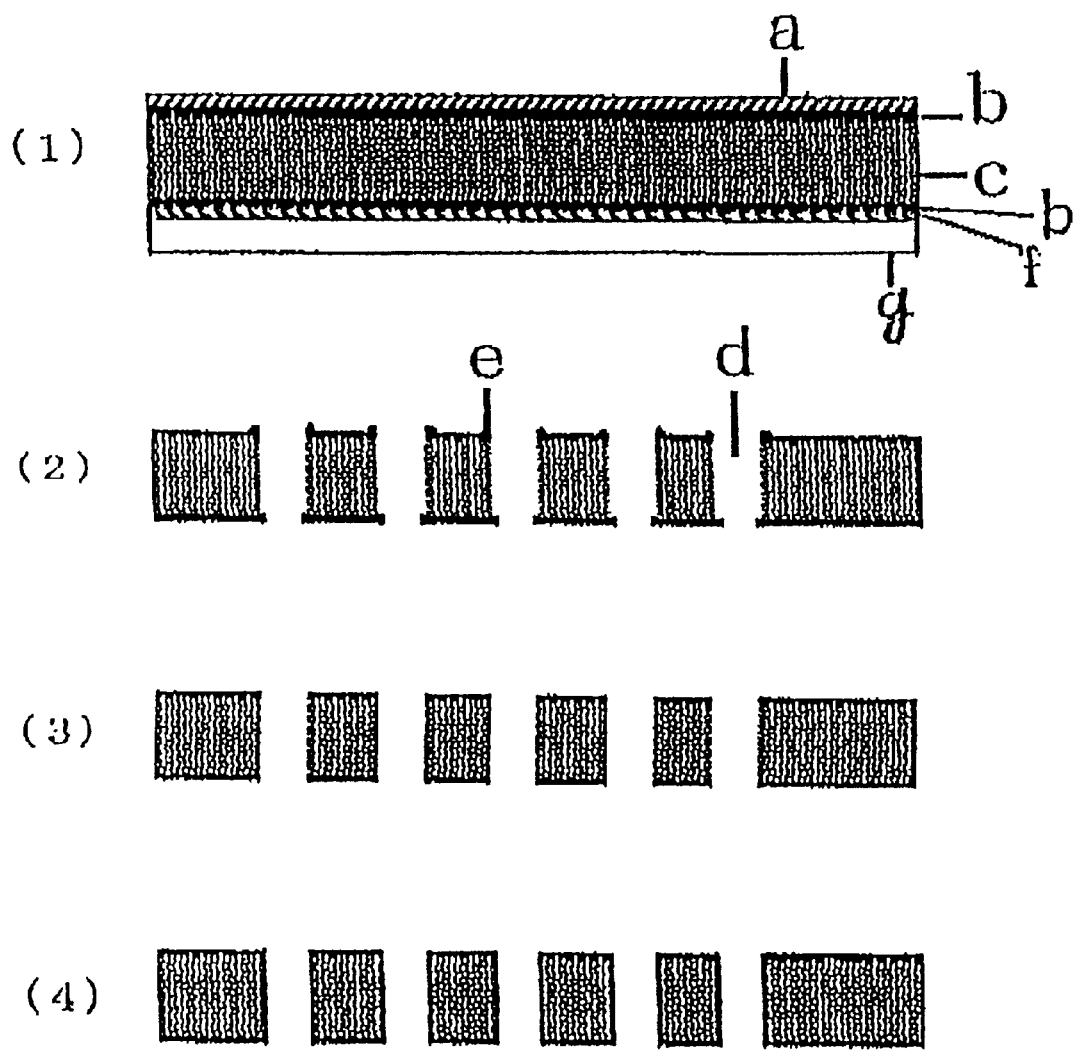
FIG. 2 shows the steps of making penetration holes for through holes with a carbon dioxide gas laser in Example 8 in which a backup sheet is provided.

In the present invention, for forming a penetration hole for a through hole in a thermosetting resin copper-clad laminate having at least two copper layers by processing copper foils of the thermosetting resin copper-clad laminate with an energy of 20 to 60 mJ/pulse sufficient for removing the copper foils by means of the pulse oscillation of a carbon dioxide gas laser, there is formed or disposed a coating or a sheet (to be sometimes referred to as "auxiliary material" hereinafter) of an organic substance containing 3 to 97% by volume of at least one powder selected from the group consisting of a metal compound powder, a carbon powder and metal powder which have a melting point of at least 900° C. and a bond energy of at least 300 KJ/mol on at least a copper foil surface to be irradiated with the carbon dioxide gas laser, and a surface thereof is irradiated with necessary pulses of the carbon dioxide gas laser to form the penetration hole.

Then, the entire surface of a copper foil on each surface is etched to remove part of the thickness thereof and at the same time to remove copper foil burrs fluffing on a penetration hole portion, whereby the penetration hole for forming a through hole by plating is obtained in which copper foils existing around the hole are retained. In this manner, positions of copper foils which are around the hole and on the front and reverse surfaces are not deviated, lands can be formed, the through hole are not curved, and the thickness of each copper foil is decreased. In the following formation of a circuit of narrow lines on the front and reverse copper foils obtained by metal plating, therefore, defects such as a short circuit and a pattern breakage do not occur, and a high-density printed wiring board can be produced. Further, the processing rate with a carbon dioxide gas laser is remarkably high as compared with the processing rate with a drill, and the method of the present invention is therefore excellent in productivity and excellent in economic performances.

After the penetration hole for a through hole is made, the entire surface of a copper foil on each surface may be mechanically polished without etching it with a chemical. However, it is preferred to etch the entire above surface with a chemical for removing burrs and forming a fine pattern. According to the present invention, further, the penetration hole for a through hole can be made not only in a double-side copper-clad laminate but also in a multi-layered laminate obtained by the use of the same resin composition.

In the drawings attached to the present specification, a shows a coating of a resin containing a metal or metal compound powder, b shows a copper foil, c shows a glass fabric substrate thermosetting resin layer, d shows a portion where a penetration hole is made with a carbon dioxide gas laser, e shows burrs, f shows a water-soluble resin composition, and g shows a surface-gross aluminum foil.

The present invention may employ a method in which auxiliary materials are disposed or formed on the copper foil surfaces of 2 to 10 copper-clad laminates, one auxiliary material on the copper foil surface of one copper-clad laminate, the 2 to 10 copper-clad laminates are stacked, and the upper surface of the stacked copper-clad laminates is directly irradiated with necessary pulses of a high-output carbon dioxide gas laser to make penetration holes, particularly holes having a small diameter, for through holes in the above 2 to 10 copper-clad laminates at the same time. The copper-clad laminates in which the penetration holes are made are used for mounting semiconductor chips thereon. In this case, auxiliary materials formed of a water-soluble resin may be disposed on the copper-clad laminates, one auxiliary material on one copper-clad laminate, the copper-clad laminates may be stacked and allowed to adhere to each other, and the through holes may be made.

The copper-clad laminate used in the present invention is not critical. For example, it includes generally known copper-clad laminates (multi-layered boards) such as a double-side copper-clad laminate formed of a glass fabric substrate impregnated with a thermosetting resin composition (glass-fiber-reinforced prepreg impregnated with a thermosetting resin composition) and copper foils bonded to both the surfaces, a multi-layered board of such laminates, a multi-layered board formed by providing a glass-fabric-substrate-reinforced copper-clad laminate as an internal layer, placing an ultraviolet-curable resin composition on each surface of the laminate and repeating copper plating, a board or film formed by bonding a copper foil to a polyimide film with an adhesive and a copper-clad laminate having an organic fiber as a substrate. Of these, there is preferably used a double-side copper-clad laminate formed by providing a glass fabric as a substrate and uniformly impregnating the glass fabric with a thermosetting resin composition containing an inorganic insulating filer. A penetration hole for a through hole can be naturally made in a copper-clad laminate having one copper layer. Although not specially limited, the thickness of the copper-clad laminate is preferably 0.05 to 1.0 mm.

The substrate is not specially limited. As an inorganic fiber, there are used a grass woven fabric and a glass non-woven fabric which are generally known. Specifically, the glass fibers include E, S, D and N glass fibers. The glass content in the substrate impregnated with thermosetting resin composition is not critical, while it is generally 30 to 85% by weight. As an organic fiber, there are usd woven fabrics and non-woven fabrics of a wholly aromatic polyamide fiber and a liquid crystal polyester fiber. Further, a polyimide film may be used in a form in which a resin layer is bonded to one or each surface of the film.

The resin of the thermosetting resin composition used in the present invention can be selected from generally known thermosetting resins. Specific examples of the resin include an epoxy resin, a polyfunctional cyanate ester resin, a polyfunctional maleimide-cyanate ester resin, a polyfunctional maleimide resin and an unsaturated-group-containing polyphenylene ether resin. These resins are used alone or in combination. In view of the form of a through hole formed by processing by the irradiation with a high-output carbon dioxide gas laser, it is preferred to use a thermosetting resin composition having a glass transition temperature of at least 150° C. In view of humidity resistance, anti-migration properties and electric characteristics after moisture absorption, it is preferred to use a polyfunctional cyanate ester resin composition. The above thermosetting resin composition may contain a black or dark dye or pigment.

The polyfunctional cyanate ester as a component of the thermosetting resin in the present invention refers to a compound whose molecule has at least 2 cyanato groups. Specific examples thereof include 1,3- or 1,4-cyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate and cyanates obtained by a reaction of novolak with cyan halide.

Besides the above compounds, there may be used polyfunctional cyanate ester compounds described in Japanese Patent Publications Nos. 41-1928, 43-18468, 44-4791, 45-11721, 46-41112 and 47-26853 and JP-A-51-63149. Further, prepolymers having a molecular weight of 400 to 6,000 and having a triazine ring formed by the trimerization of cyanato group of each of these polyfunctional cyanate ester compounds may be also used. The above prepolymer is obtained by polymerizing the above polyfunctional cyanate ester monomer in the presence of an acid such as a mineral acid or a Lewis acid; a base such as sodium alcoolate or a tertiary amine or a salt such as sodium carbonate as a catalyst. The prepolymer contains an unreacted monomer and is in the form of a mixture of monomer with prepolymer, and this material is preferably used in the present invention. When used, generally, the above resin is dissolved in an organic solvent in which it is soluble.

The epoxy resin can be generally selected from known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin, polyepoxy compounds obtained by epoxidizing the double bond of butadiene, pentadiene, vinylcyclohexene or cyclopentyl ether, and polyglycidyl compounds obtained by reacting a polyol, a silcion resin having a hydroxyl group and epohalohydrin. These resins may be used alone or in combination.

The polyimide resin can be generally selected from known polyimide resins. Specific examples thereof include reaction products of functional maleimides and polyamines, and polyimides terminated with a triple bond, described in JP-B-57-005406.

The above thermosetting resins may be used alone, while it is preferred to use a combination thereof as required in view of a balance of characteristics.

The thermosetting resin composition used in the present invention may contain various additives as desired so long as the inherent properties of the composition are not impaired. Examples of the additives include monomers containing a polymerizable double bond such as an unsaturated polyester and prepolymers thereof; low-molecular-weight liquid—high-molecular-weight elastic rubbers such as polybutadiene, epoxidized butadiene, maleated butadiene, a butadiene-acrylonitrile copolymer, polychloroprene, a butadiene-styrene copolymer, polyisoprene, butyl rubber, fluorine-containing rubber and natural rubber; polyethylene, polypropylene, polybutene, poly-4-methylpentene, polystyrene, AS resin, ABS resin, MBS resin, styrene-isoprene rubber, a polyethylene-propylene copolymer, 4-fluoroethylene-6-fluoroethylene copolymer; high-molecular-weight prepolymers or oligomers such as polycarbonate, polyphenylene ether, polysulfone, polyester and polyphenylene sulfide; and polyurethane. These additives are used as required. Further, various known additives such as inorganic or organic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition in the present invention undergoes curing itself under heat. Since, however, its curing rate is low, it is poor in workability and economic performances, etc., and a known heat-curing catalyst is incorporated into the thermosetting resin. The amount of the catalyst per 100 parts by weight of the thermosetting resin is 0.005 to 10 parts by weight, preferably 0.01 to 5 parts by weight.

The inorganic insulating filler can be selected from generally know fillers. Specific examples thereof include silicas such as natural silica, calined silica and amorphous silica; white carbon, titanium white, aerogel, clay, talc, wollatonite, natural mica, synthesized mica, kaolin, magnesia, alumina and perlite. The amount of the above filler in the resin composition is 10 to 60% by weight, preferably 15 to 50% by weight.

Further, it is preferred to add a black dye or pigment to the resin for preventing the scattering of laser beam of a carbon dioxide gas laser. The particle diameter of the black dye or pigment is preferably 1 µm or less for forming a uniform dispersion. The dye or pigment can be selected from generally known dyes or pigments. The amount thereof based on the resin is preferably 0.1 to 10% by weight. Further, there may be used a glass fiber of which the fiber surface is dyed in black.

The copper foil for use as the outermost layers can be selected from generally known copper foils. Preferably, an electrolytic copper foil having a thickness of 3 to 18 µm is used. As a copper foil for use as an internal layer, an electrolytic copper foil having a thickness of 5 to 18 µm is preferably used.

A substrate-reinforced copper-clad laminate is prepared by impregnating the substrate with the thermosetting resin composition, drying the composition to obtain a B-staged prepreg, then laminating a predetermined number of the so-obtained prepregs, placing copper foils on the upper and lower surfaces of the laminated prepregs, one on each surface, and laminate-forming the resultant set under heat and pressure, to obtain a double-side copper-clad laminate. When the copper-clad laminate is formed to have a cross section where the resin and the inorganic filler other than glass are homogeneously dispersed, a penetration hole can be uniformly formed with a carbon dioxide gas laser. Further, when the copper-clad laminate has a black color, it is easier to make a uniform hole free of uneven wall surfaces since the scattering of laser beam is prevented.

The metal compound for the metal compound powder for use on the copper foil surface in the present invention can be selected from generally known metal compounds. Specific examples thereof include oxides such as titanias typified by titanium oxide, magnesias typified by magnesium oxide, iron oxides typified by iron oxide, nickel oxides typified by nickel oxide, copper oxides typified by copper oxide, manganese oxides typified by manganese dioxide, zinc oxides typified by zinc oxide, silicon dioxide, aluminum oxide and cobalt oxide. Further, powders of E, A, C, L, D, S, N and M glasses are mixtures of the above metal compounds, and they can be used in the present invention as well.

Further, the above metal compound includes generally known non-oxide substances such as silicon carbide, tungsten carbide, boron nitride, silicon nitride, titanium nitride, aluminum nitride, barium sulfate, calcium carbonate, rare earth metal sulfates. Carbons can be also used.

Further, there may be used powders of simple substances such as silver, aluminum, bismuth, cobalt, copper, iron, manganese, molybdenum, nickel, vanadium, antimony, silicon, tin, titanium and zinc or powders of alloys of these. These powders may be used alone or in combination.

The content of the above powder in the coating or sheet on the copper foil is 3 to 97% by volume, preferably 5 to 95% by volume.

In the above metal compound powder, preferably, compound is not dissociated under the irradiation with a carbon dioxide gas laser, and therefore, no adverse influence is caused on a semiconductor chip and the intimate contact capability of a hole wall. Na, K and Cl ions have an adverse influence on the reliability of a semiconductor, and it is therefore not preferred to use a powder containing any one of these.

Although not specially limited, the organic substance of the auxiliary material is selected from those which do not peel off when they are kneaded, coated on a copper foil surface and dried or formed into a sheet. The above organic substance is preferably selected from resins. In view of environmental friendliness, it is preferred to use a water-soluble resin selected from generally known resins such as polyvinyl alcohol, polyester, polyether and starch.

The method of preparing a composition containing the metal compound powder, carbon powder or metal powder and containing the organic substance is not critical. The above method includes a method in which the above materials are kneaded in a kneader at a high temperature in the absence of a solvent and the kneaded product is extruded in the form of a sheet, a method in which a resin composition soluble in a solvent or water is provided, the above powder is added, the combined materials are uniformly stirred and mixed to form a coating composition and the coating composition is coated on a copper foil surface and dried to form a film, a method in which the above composition is applied to a film to form a sheet, and a method in which an organic or inorganic substrate is impregnated with the above composition and dried to form a sheet containing the substrate. Preferably, the above coating or sheet is formed so as to have a total thickness of 30 to 200 µm in the case of a sheet and so as to have a thickness of 5 to 100 µm in the case of a coating. Further, the above coating or sheet is formed so as to have 0.5 to 3 µm high and deep fine concave and convex shapes for decreasing the reflection of laser beam. The metal compoud powder, or the like, is generally incorporated into the organic substance as a powder having an average particle diameter of 5 µm or less and homogeneously dispersed. The above average particle diameter is particularly preferably 1 µm or less.

In a plurality of, or 2 to 10, copper-clad laminates, a coating or a sheet of a resin composition containing at least one powder of the above metal compound powder, carbon powder or metal powder is formed or disposed on the copper foil surface of each in a hole-forming position to be irradiated with a carbon dioxide gas laser, the 2 to 10 copper-clad laminates are stacked, and the hole-forming positions are irradiated with a high-output-energy carbon dioxide gas laser of which the beam is focussed to an intended diameter, whereby holes can be made. When each copper-clad laminate has a small thickness, more copper-clad laminates can be stacked. The number of shots of laser pulses increases, which results in poor working performances. When holes are made, a backup sheet is generally used on the reverse surface as an auxiliary sheet for confining laser beam.

In the present invention, preferably, a backup sheet is disposed such that a resin layer formed of a water-soluble resin composition is in contact with the reverse-surface copper foil, and the resin layer is laminated on the reverse-surface copper foil under heat and pressure, the reverse-surface being opposite to the copper foil surface to be irradiated with a carbon dioxide gas laser.

The backup sheet which may be used in the present invention will be explained further in detail. The backup sheet for absorbing high-output carbon dioxide gas laser beam which arrives through is provided on the surface opposite to the copper foil surface to be irradiated with the carbon dioxide gas laser. The backup sheet is required to be formed of a material which can confine carbon dioxide gas laser beam which comes through the copper-clad laminate (s), for preventing the reflection of the carbon dioxide gas laser toward the copper-clad laminate(s). In the present invention, therefore, a resin layer, preferably a water-soluble resin layer, having a thickness of 20 to 200 µm is disposed on the above "reverse" surface, and a glossy metal plate having a thickness of 30 to 200 µm is placed thereon so as to be in contact with the resin layer, preferably bonded thereto at least partly, and the auxiliary material disposed or formed on the copper foil surface on the front surface is irradiated directly with an energy of 20 to 60 mJ/pulse of the output of a carbon dioxide gas laser, to make hole(s). In this case, the carbon dioxide gas laser energy which arrives through is absorbed into the resin layer of the backup sheet, and part of the energy is reflected on the glossy metal plate positioned below the resin layer. However, the energy is not sufficient for making a hole in the metal plate and the reflected energy is absorbed into the resin layer, so that penetration hole(s) can be made without causing damage on the reverse-surface copper foil. Further, a gloss-less metal sheet may be also used. The backup sheet may be simply placed, while it is preferred to attach it to the reverse-surface copper foil with a heating roll.

When the backup sheet having a metal sheet or the film sheet having a resin is laminated under heat and pressure, the resin layer of the backup sheet or the film sheet is arranged to be in contact with the copper foil surface, and the resin layer is laminated and fused into the copper foil surface with a heating roll at a temperature of generally 40 to 150° C., preferably 60 to 120° C., at a linear pressure of generally 0.5 to 30 kgf/cm, preferably 1 to 5 kgf/cm. The above lamination temperature differs depending upon the melting point of the water-soluble resin selected, and it also differs depending upon the linear pressure and a laminating rate. Generally, the above lamination temperature is set at a temperature higher than the melting point of the selected water-soluble resin by 5 to 200° C.

When room temperature is employed for the above lamination, the surface of the applied resin layer is wetted 3 μm or less deep with water before the lamination, to dissolve the water-soluble resin to some extent, and the lamination can be carried out under the above pressure. The method of the above wetting is not specially limited, and for example, there may be employed a method in which the surface of the applied resin layer is continuously wetted with water by means of a roll and the lamination on the copper-clad laminate surface is continuously carried out, or a method in which water is continuously sprayed to the applied resin layer surface and the lamination on the copper-clad laminate surface is continuously carried out. The lamination under an elevated temperature is preferred since the peeling of the backup sheet is easier after a penetration hole is made.

Most preferably, a sheet or a coating of the auxiliary material is disposed or formed on the upper surface of a copper-clad laminate, the backup sheet is disposed on the reverse surface of the copper-clad laminate, and the resultant upper surface is irradiated with a high-output carbon dioxide gas laser. When the backup sheet is not in intimate contact with (not firmly laminated on) the copper-clad laminate, carbon adheres to vicinities of the hole, and the problem of contamination may be caused in steps to follow. It is therefore preferred to keep the backup sheet in intimate and firm contact to the copper-clad laminate.

The thickness of each of the resin layer and the metal plate shall not be limited to the above range, and it may be greater. However, the above thickness ranges are preferred in view of economic performances.

Further, the above backup sheet can be used in a method in which a predetermined size of a copper foil of a copper foil surface to be irradiated with a carbon dioxide gas laser is removed by etching, an insulating layer formed of a resin and the like are first removed by the output of 5 to 19 mJ/pulse of the carbon dioxide gas laser and a penetration hole is made by increasing the output to 20 to 60 mJ/pulse. The above backup sheet when it has a greater thickness can be used with a YAG laser.

When a penetration hole is made with a carbon dioxide gas laser by its irradiation with an output energy of 20 to 60 mJ/pulse, burrs occur around the hole. After the irradiation with the carbon dioxide gas laser, therefore, both the surfaces of the copper-clad laminate are etched to remove part of the thickness thereof and form smooth surfaces and at the same time to remove the burrs. The resultant copper foils are suitable for forming fine patterns thereon, the penetration hole is plated to form a through hole, and the copper foils suitable for a high-density printed wiring board are retained around the hole.

The method of removing the burrs of copper which occur in the penetration hole portion is not critical. There can be employed a method of removing a metal surface by dissolving it with a chemical (called "SUEP method") disclosed in JP-A-02-22887, JP-A-02-22896, JP-A-02-25089, JP-A-02-25090, JP-A-02-59337, JP-A-02-60189, JP-A-02-166789, JP-A-03-25995, JP-A-03-60183, JP-A-03-94491, JP-A-04-199592 and JP-A-04-263488. In this method, the etching is carried out generally at a rate of 0.02 to 1.0 μm/second.

A carbon dioxide gas laser generally uses a wavelength of 9.3 to 10.6 μm in an infrared wavelength region. The output thereof is 20 to 60 mJ/pulse, preferably 22 to 50 mJ/pulse. When the output is less than 20 mJ/pulse, a hole can be made, when using the auxiliary material of the present invention, by increasing the number of shots, while it takes time and is not effective.

According to the present invention, there is provided a method of making a penetration hole in which a highly reliable penetration hole for a through hole can be made in a thermosetting resin-impregnated copper-clad laminate having at least two copper layers without removing any copper foil in advance. According to the present invention, further, there is provided a method of making a penetration hole for a through hole, in which, after the penetration hole is made, both the copper foil surfaces are etched to decrease the thickness of each copper foil whereby burrs around and in a penetration hole portion can be removed by the etching and those copper foils on both the surfaces which are adjacent to and around the penetration hole are retained. According to the present invention, further, there is provided a method of making a penetration hole in which a land can be formed without deviating copper foil positions on both the surfaces from each other, and the through hole cannot be curved along a through hole direction. According to the present invention, further, there is provided a method of making a penetration hole, in which the copper foil surfaces can be removed in thickness direction to some extent by etching when burrs in a hole portion are removed by etching, which is advantageous for producing a high-density printed wiring board free from the occurrence of a short circuit and a pattern breakage when front-surface and reverse-surface circuits are formed by copper plating in a step to follow. According to the present invention, there is provided a method of making penetration holes, in which penetration holes can be made in a plurality of stacked copper-clad laminates at the same time. According to the present invention, further, there is provided a method of making a penetration hole, in which the processing rate is remarkably high as compared with the processing rate of a drill, and the productivity is remarkably improved. The copper-clad laminate, the auxiliary material and the backup sheet of the present invention are remarkably suitable for the above methods of making penetration holes.

EXAMPLES

The present invention will be explained more in detail with reference to Examples and Comparative Examples hereinafter, in which "part" stands for "part by weight" unless otherwise specified.

Example 1

900 Parts of 2,2-bis(4-cyanatophenyl)propane and 100 parts of bis(4-meleimidephenol)methane were melted at 150° C. and allowed to react for 4 hours with stirring, to prepare a prepolymer. The prepolymer was dissolved in mixed solvents of methyl ethyl ketone and dimethylformamide. To this solution were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture were added 500 parts of an inorganic filler (trade name: Calcined Talc BST-200, average particle diameter 0.4 $\mu$m, supplied by Nippon Talc K.K.) and 2 parts of a black pigment, and these materials were homogeneously stirred and mixed to prepare a varnish A.

The above varnish was used to impregnate a 100 $\mu$m thick glass woven fabric, and the impregnated glass woven fabric was dried at 150° C. to prepare prepregs (prepregs B) having a gelation time of 120 second at 170° C. and having a glass fabric content of 57% by weight.

Four of the above prepregs B were stacked, electrolytic copper foils having a thickness of 12 $\mu$m each were placed on the stacked prepregs B, one on one surface and the other on the other surface, and the resultant set was laminate-formed at 200° C. at 20 kgf/m under a vacuum of 30 mmHg or less for 2 hours, to give a double-side copper-clad laminate C having an insulation layer thickness of 400 $\mu$m.

800 Parts of a black copper oxide powder (average particle diameter 0.9 $\mu$m) as a metal oxide powder was added to a varnish of a polyvinyl alcohol powder in water, and these materials was homogeneously mixed (varnish D). The varnish D was applied onto the above double-side copper-clad laminate to form a 60 $\mu$m thick layer, and the layer was dried at 110° C. for 30 minutes to form a coating having an oxide content of 90% by volume. The surface had a roughness of 0.7 to 1.0 $\mu$m.

The above copper-clad laminate surface was 8 pulses (shots) irradiated directly with a carbon dioxide gas laser at an output of 40 mJ/pulse to form 900 penetration holes having a diameter of 100 $\mu$m at intervals of 300 $\mu$m in each of 70 blocks.

The coating on the surface was removed by washing it with water having a temperature of 60° C., the surface was desmeared, and then, copper foil burrs around the holes were removed and the copper foil on the surface was dissolved until the copper foil had a thickness of 7 $\mu$m by the SUEP method. Copper was plated on the resultant board by a general method to form a 15 $\mu$m thick layer (total thickness: 22 $\mu$m). A copper foil for a land entirely remained around the holes.

Circuits (200, line/space=50/50 $\mu$m), lands for solder balls, and the like were formed on both the surfaces of the board, and coated with a plating resist in portions other than at least a semiconductor chip, bonding pads and solder ball pads, and nickel plating and gold plating were carried out, to complete a printed wiring board. Table 1 shows the evaluation results to the printed wiring board.

Example 2

A double-side copper-clad laminate was prepared in the same manner as in Example 1, but not black pigment was added. A black coating composition (varnish D) was applied to the front surface of the laminate and dried to form a coating. Then, the front surface was 9 pulses (shots) irradiated with a carbon dioxide gas laser at an output of 40 mJ/pulse to form penetration holes. Thereafter, Example 1 was repeated to complete a printed wiring board. Table 1 shows the evaluation results to the printed wiring board.

Example 3

700 Parts of an epoxy resin (trade name: Epikote 5045), 300 parts of an epoxy resin (trade name: ESCN-220F), 35 parts of dicyandiamide and 1 part of 2-ethyl-4-methylimidazole were dissolved in mixed solvents of methyl ethyl ketone and dimethylformamide, further, 800 parts of calcined talc (trade name: BST-200) was added, and these materials were forcibly stirred and uniformly dispersed, to give a varnish E. The varnish E was used to impregnate a 100 $\mu$m thick glass woven fabric and dried to give prepregs (prepregs E) having a gelation time of 150 seconds and having a glass fabric content of 53% by weight.

Two of the prepregs E were stacked, 12 $\mu$m thick electrolytic copper foils were placed on both the surfaces of the stacked prepregs, one on one surface and the other on the other surface, and the resultant set was laminate-formed at 190° C. at 20 kgf/cm² under a vacuum of 30 mmHg or less for 2 hours, to obtain a double-side copper-clad laminate, which had an insulating layer thickness of 200 $\mu$m. Circuits were formed on the front and reverse surfaces of the laminate, followed by a treatment to form black copper oxide, to obtain an internal-layer board G.

Further, a 80 $\mu$m thick liquid crystal polyester fiber non-woven fabric was impregnated with the above varnish E, and the varnish E was dried to give prepregs having a geleation time of 105 seconds. The so-obtained prepregs were placed on the upper and lower surfaces of the above internal-layer board G, 12 $\mu$m thick electrolytic copper foils were placed thereon, and the resultant set was similarly laminate-formed to obtain a four-layered board.

Separately, a metal compound powder (SiO$_2$: 57 wt %, MgO: 43 wt %, average particle diameter: 0.4 $\mu$m) was added to a resin aqueous solution containing polyvinyl alcohol and starch, and these materials were homogeneously mixed and stirred. The resultant mixture was applied to a 50 $\mu$m thick polyethylene terephthalate film to form a layer having a thickness of 25 $\mu$m, and the layer was dried at 110° C. for 25 minutes to obtain a film-like auxiliary material H having a metal compound content of 10% by volume.

The above film-like auxiliary material H was placed on the above double-side copper-clad laminate with the polyethylene terephthalate film facing upward, and the resultant double-side copper-clad laminate was 9 pulses (shots) irradiated with a carbon dioxide gas laser at an output of 30 mJ/pulse to make penetration holes for through holes. Thereafter, Example 1 was repeated to complete a multi-layered printed wiring board. Table 1 shows the evaluation results to the printed wiring board.

Comparative Example 1

The same double-side copper-clad laminate as that in Example 1 was provided, and attempts were made similarly to Example 1 to make holes in the laminate with a carbon dioxide gas laser without forming any coating on the surface of the laminate. No holes were made.

Comparative Example 2

The same double-side copper-clad laminate as that in Example 1 was provided, places where holes were to be made were blackened with a black marker ink, and attempts were made in the same manner as in Example 1 to make holes in the places by irradiation with a carbon dioxide gas laser. No holes were made.

Comparative Example 3

A double-side copper-clad laminate was prepared in the same manner as in Example 3 except that the two epoxy resins used in Example 3 were replaced with 1,000 parts of one epoxy resin (Epikote 5045) alone. The varnish D prepared in Example 1 was similarly applied to the copper foil surfaces and dried to form 60 μm thick coatings, and the resultant laminate was 19 shots irradiated with a carbon dioxide gas laser at an output of 17 mJ/pulse to make penetration holes for through holes. On each hole wall, fluffing of glass fibers was found, each hole was eccentric in form and had an ellipsoidal form. Then, a printed wiring board was prepared in the same manner as in Example 3 without carrying out the SUEP treatment. Table 1 shows the evaluation results to the printed wiring board.

Comparative Example 4

The same double-side copper-clad laminate as that in Example 1 was used, and holes were made in the laminate at intervals of 300 μm with a mechanical drill having a diameter of 100 μm at a turn of 100,000 rpm at a feed rate of 1 m/minute.

After desmearing treatment, copper plating was similarly carried out, and circuits were formed on the front and reverse surfaces, followed by the same procedures as those in Example 1, to obtain a printed wiring board. During the drilling, two drills were broken. Table 1 shows the evaluation results to the printed wiring board.

Comparative Example 5

900 Holes having a diameter of 100 μm were made in the copper foil surface of the same double-side copper-clad laminate as that in Example 1 at intervals of 300 μm by etching the copper foil. Similarly, 900 holes having a diameter of 100 μm were made in corresponding portions of the copper foil surface on the reverse side. 900 Penetration holes for through holes were made in each of 70 blocks, 63,000 holes in total, by 8 pulse (shots) irradiation with a carbon dioxide gas laser at an output of 40 mJ/pulse. Then, desmearing treatment was carried out in the same manner as in Comparative Example 4, copper plating was carried out to form a copper layer having a thickness of 15 μm on each surface, and circuits were made on each surface, to complete a printed wiring board. Table 1 shows the evaluation results to the printed wiring board.

TABLE 1

|  | Example | | | Comparative Example | | |
| --- | --- | --- | --- | --- | --- | --- |
|  | 1 | 2 | 3 | 3 | 4 | 5 |
| Deviation of hole positions on the front and reverse surfaces (μm) | 0 | 0 | 0 | 0 | 0 | 25 |
| Form of holes | Circular | Slightly ellipsoidal | Circular | Ellipsoidal | Circular | Circular |
| Pattern breakage and short circuit | 0/200 | 0/200 | 0/200 | 55/200 | 57/200 | 57/200 |
| Glass transition temperature (° C.) | 235 | 235 | 160 | 139 | 234 | 234 |
| Through hole-heat cycle test | 2.5 | 2.8 | 5.7 | 25.0 | 2.6 | 5.0 |
| Insulation resistance value after pressure cooker treatment (Ω) Normal state | $6 \times 10^{13}$ | — | — | $6 \times 10^{13}$ | | |
| 200 hours | $4 \times 10^{12}$ | | | $3 \times 10^{9}$ | | |
| 500 hours | $5 \times 10^{11}$ | | | $<10^{8}$ | | |
| 700 hours | $3 \times 10^{11}$ | | | — | | |
| 1,000 hours | $9 \times 10^{10}$ | | | | | |
| Anti-migration properties (Ω) Normal state | $5 \times 10^{13}$ | — | — | $6 \times 10^{13}$ | | |
| 200 hours | $4 \times 10^{12}$ | | | $8 \times 10^{9}$ | | |
| 500 hours | $5 \times 10^{11}$ | | | $1 \times 10^{9}$ | | |
| 700 hours | $3 \times 10^{11}$ | | | $<10^{8}$ | | |
| 1,000 hours | $1 \times 10^{11}$ | | | — | | |
| Processing time period for making holes (minute) | 24 | 26 | 26 | — | 630 | — |

<Measurement Methods>
1) Deviation of Hole Positions on the Front and Reverse Surfaces, and Time Period for Making Holes 900 Holes/block, each hole having a diameter of 100 μm, were made in 70 blocks in a work having a square 10 size of 250×250 mm (63,000 holes in total).

The holes were made with a carbon dioxide gas laser or with a mechanical drill. Table 1 shows the maximum values of required time periods and the maximum values of deviations of hole positions on the front and reverse surfaces.

2) Circuit Pattern Breakage and Short Circuit

In Examples and Comparative Examples, boards having no holes made were similarly prepared, comb-like patterns having a line/space=50/50 μm were prepared, and then 200 patterns were visually observed through a magnifier after etching. A numerator shows the total of patterns which had a circuit pattern breakage and a short circuit.

3) Glass Transition Temperature

Measured by a DMA method.

4) Through Hole-Heat Cycle Test

A land having a diameter of 200 μm was formed in each through hole, and 900 holes were connected alternately from one surface to the other surface. One heat cycle consisted of immersion for soldering at 260° C. for 30 seconds and standing at room temperature for 5 minutes, and 200 cycles were repeated. Table 1 shows the maximum value of change ratios of resistance values.

5) Insulation Resistance Value After Pressure Cooker Treatment

In Examples and Comparative Examples, laminates free of any pattern breakage and short circuit of patterns of line/space=50/50 μm were selected, the laminates were subjected to blackening treatment, then, one prepreg which was the same as that used in the concerned Example or Comparative Example was placed thereon, a 12 μm thick electrolytic copper foil was placed thereon, and the resultant set was laminate-formed under the same conditions to form a multi-layered board. A circuit was formed thereon, and the multi-layered board was maintained at 121° C. under 2 atmospheric pressures for a predetermined period of time, taken out and allowed to stand at 25° C. at 60%RH for 2 hours. Then, 500 VDC was applied for 60 seconds, and the board was measured for an inter-terminal insulation resistance value.

6) Anti-Migration Properties

Two through holes having a diameter of 100 μm and having a hole-hole distance of 300 μm were independently connected, and 100 sets of such connections were made. 50 VDC was applied in an atmosphere of 85° C. and 85%RH, and an insulation resistance value between the through holes after treatment for a predetermined period of time was measured.

Comparative Example 6

A double-side copper-clad laminate was prepared in the same manner as in Example 1 except that no inorganic insulating filler was used. Penetration holes for through holes were made by the irradiation with a carbon dioxide gas laser in the same manner as in Example 1. Mechanical polishing was carried out once without the SUEP treatment, to obtain a printed wiring board. Table 2 shows the evaluation results.

TABLE 2

|  |  | Comparative Example 6 |
|---|---|---|
| Deviation of hole positions on the front and reverse surfaces (μm) |  | 0 |
| Form of holes |  | Circular |
| Form of internal wall of hole |  | Roughened largely |
| Pattern breakage and short circuit |  | 55/200 |
| Glass transition temperature (° C.) |  | 235 |
| Through hole-viahole cycle test (%) |  | 3.8 |
| Insulation resistance value after pressure cooker treatment (Ω) | Normal state | — |
|  | 200 hours |  |
|  | 500 hours |  |
|  | 700 hours |  |
|  | 1,000 hours |  |
| Anti-migration properties (Ω) | Normal state | — |
|  | 200 hours |  |
|  | 500 hours |  |
|  | 700 hours |  |
|  | 1,000 hours |  |
| Processing time period for making holes (minute) |  | — |

Example 4

A varnish I was prepared in the same manner as in the preparation of the varnish A in Example 1 except that 4 parts of an epoxy coupling agent was further added. Then, a double-side copper-clad laminate J having an insulating layer thickness of 400 μm was prepared in the same manner as in Example 1 except that the varnish A was replaced with the above varnish I.

Separately, 800 parts of a black copper oxide powder having an average particle diameter of 0.9 μm was added to a varnish of a polyvinyl alcohol powder (melting point 83° C.) in water, and these materials were homogeneously stirred and mixed. The mixture was applied onto a 25 μm thick polyethylene terephthalate film to form a layer having a thickness of 20 μm, and the layer was dried at 110° C. for 30 minutes to form a film-attached sheet (auxiliary material K) having a metal oxide content of 13% by volume. The film-attached sheet was placed on the above double-side copper-clad laminate J. Three sets of the above auxiliary material K and the above double-side copper-clad laminate J were prepared in this manner, and stacked, and the upper surface of the stacked sets was 19 pulses (shots) irradiated with a carbon dioxide gas laser at an output of 40 mJ/pulse to make 900 penetration holes having a diameter of 100 μm each for through holes at intervals of 300 μm in each of 70 blocks. The auxiliary materials K on the surfaces were removed, and the SUEP method was carried out to dissolve and remove copper foil burrs around the holes and at the same to dissolve the surface copper foil until the copper foil had a thickness of 5 μm in each board. Each board was copper plated to form a layer having a thickness of 15 μm (total thickness: 20 μm) according to a conventional method. The entire copper foil around the holes for lands remained on each board. Circuits (200, line/space=50/50 μm), lands for solder balls, and the like were formed on both the surfaces of each board, and coated with a plating resist in portions other than at least a semiconductor chip, bonding pads and solder ball pads, and nickel plating and gold plating were carried out, to complete printed wiring boards. Table 3 shows the evaluation results to the printed wiring boards.

Example 5

1,400 Parts of an epoxy resin (trade name: Epikote 5045), 600 parts of an epoxy resin (trade name: ESCN220F), 70 parts of dicyandiamide and 2 parts of 2-ethyl-4-methylimidazole were dissolved in mixed solvents of methyl ethyl ketone and dimethylformamide, 800 parts of an inorganic insulating filler (trade name: BST200, average particle diameter 0.4 μm, supplied by Nippon Talc K.K.) was added, and the mixture was forcibly stirred and uniformly dispersed to obtain a varnish. A 100 μm thick glass woven fabric was impregnaed with the above varnish, and the varnish was dried to give prepregs (prepregs L) having a gelation time of 150 seconds and a glass fabric content of 55% by weight. One prepreg L was used. Electrolytic copper foils having a thickness 12 μm were placed on both the surfaces of the prepreg L, one on one surface and the other on the other surface, and the resultant set was laminate-formed at 190° C. at 20 kgf/cm² under a vacuum of 30 mmHg or less for 2 hours to obtain a double-side copper-clad laminate M. The insulating layer had a thickness of 100 μm.

Separately, a metal oxide containing 43% by volume of MgO and 7% by volume of $SiO_2$ and having an average particle diameter of 0.8 μm was dissolved in a polyvinyl alcohol solution???, and the resultant solution was applied to a 25 μm thick polyethylene terephthalate film to form a layer having a thickness of 25 μm. The layer was dried to give a sheet to which a resin composition layer having a metal oxide content of 90% by weight was attached. The sheet was placed on the above double-side copper-clad laminate M and laminated in the same manner as in Example 4. Eight sets of the above auxiliary material and the above double-side copper-clad laminate were prepared in this manner and stacked. The upper surface of the stacked sets was 25 pulses (shots) irradiated with a carbon dioxide gas laser at an output of 40 mJ/pulse to make penetration holes for through holes. Thereafter, the printed wiring boards were prepared in the same manner as in Example 4. Table 3 shows the evaluation results to the printed wiring boards.

Comparative Example 7

Eight double-side copper-clad laminates were prepared in the same manner as in Example 5 except that the two epoxy resins were replaced with 2,000 parts of Epikote 5045 alone.

holes in total. These three copper-clad laminates were stacked, and the upper surface of the stacked laminates were 19 pulses (shots) irradiated with a carbon dioxide gas laser at an output of 40 mJ/pulse to make penetration holes for through holes. Thereafter, the copper foil surfaces of each laminate was mechanically polished, copper was plated to form a layer having a thickness of 15 μm on each surface without carrying out the SUEP treatment, circuits were formed on the front and reverse surfaces of each, and then, printed wiring boards were prepared in the same manner as in Example 4. Table 3 shows the evaluation results to the printed wiring boards.

TABLE 3

|  | Example | | Comparative Example | |
| --- | --- | --- | --- | --- |
|  | 4 | 5 | 7 | 8 |
| Deviation of hole positions on the front and reverse surfaces (μm) | 0 | 0 | 0 | 25 |
| Form of holes | Circular | Circular | Ellipsoidal | Circular in upper board, ellipsoidal in lower boards |
| Internal wall surface of hole | Nearly straight | Nearly straight | Uneven to a great extent | Nearly straight |
| Size of holes | Nearly identical from top board to lowest board | Nearly identical from top board to lowest board | Lower boards having smaller diameters | Nearly identical in upper side boards, smaller and irregular in lower side boards |
| Chipping of copper foil around land | No | No | No | Yes |
| Pattern breakage and short circuits (number of places) | 0/200 | 0/200 | 55/200 | 57/100 |
| Glass transition temperature (° C.) | 235 | 160 | 139 | 235 |
| Through hole-heat cycle test (%) | 2.6 | 4.3 | 27.8 | 10.9 |
| Processing time period for making holes (minute) | 17 | 10 | 16 | — |

The same sheets as that used in Example 5 were placed on the copper foil surfaces, one sheet on one copper foil surface, and eight sets of the above sheet and the double-side copper-clad laminate were stacked. The upper surface of the stacked sets was 41 pulses (shots) irradiated with a carbon dioxide gas laser at an output of 17 mJ/pulse to make penetration holes for through holes. Glass fibers were observed on the hole walls of the penetration holes, and the holes had an eccentric form and had an ellipsoidal form. The so-prepared laminates were washed with hot water and mechanically polished without carrying out the SUEP treatment, to obtain printed wiring boards. Table 3 shows the evaluation results to the printed wiring boards.

Comparative Example 8

900 Holes having a diameter of 100 μm were made in the copper foil surface of each of the same three double-side copper-clad laminate as those in Example 4 at intervals of 300 μm by etching the copper foil. Similarly, 900 holes having a diameter of 100 μm were made in corresponding portions of the copper foil surface on the reverse side of each to make 900 holes per pattern in each of 70 blocks, 63,000

Example 6

A double-side copper-clad laminate C having an insulating layer thickness of 400 μm was prepared in the same manner as in Example 1. A coating composition prepared by dissolving a copper powder (average particle diameter: 0.9 μm) in a polyvinyl alcohol aqueous solution was applied to the surface of the above double-side copper-clad laminate C to form a layer having a thickness of 60 μm, and the layer was dried to form a coating having a metal powder content of 10% by volume. The coating surface was 6 pulses (shots) irradiated with a carbon dioxide gas laser at an output of 40 mJ/pulse to make 900 penetration holes having a diameter of 100 μm for through holes at intervals of 300 μm in each of 70 blocks. Burrs around the holes were dissolved and removed, and the copper foil surface was dissolved until the copper foil had a thickness of 5 μm, by the SUEP method. Copper was plated on the resultant board by a conventional method to form a 15 μm thick plating layer (total thickness: 20 μm). The entire copper foil around the holes remained. Circuits (200, line/space=50/50 μm), lands for solder balls, etc., were formed on the front and reverse surfaces, portions other than at least semiconductor chip portions, bonding pad portions and solder ball pad portions were coated with a plating resist, and nickel plating and gold plating were carried out to obtain a printed wiring board. Table 4 shows the evaluation results to the printed wiring board.

Example 7

A nickel powder (average particle diameter 0.7 μm) was added to a resin aqueous solution containing polyvinyl alcohol and starch, and these materials were uniformly stirred and mixed. The mixture was applied to one surface of a 50 μm thick polyethylene terephthalate film to form a layer having a thickness of 20 μm, and the layer was dried at 110° C. for 25 minutes to obtain a film-like, hole-making auxiliary material N having a metal powder content of 90% by volume. The auxiliary material N was placed on the same four-layered copper-clad laminate as that prepared in Example 3 such that the resin layer containing the metal powder was in contact with the copper foil surface, and the auxiliary material surface was 7 pulses (shots) irradiated with a carbon dioxide gas laser at an output of 30 mJ/pulse to make penetration holes for through holes. Thereafter, the laminate was processed in the same manner as in Example 1 to obtain a printed wiring board. Table 4 shows the evaluation results to the printed wiring board.

TABLE 4

|  |  | Example | |
| --- | --- | --- | --- |
|  |  | 6 | 7 |
| Deviation of hole positions on the front and reverse surfaces (μm) | | 0 | 0 |
| Form of hole | | Circular | Circular |
| Internal wall surface of hole | | Straight | Straight |
| Pattern breakage and short circuits (number of places) | | 0/200 | 0/200 |
| Glass transition temperature (° C.) | | 235 | 160 |
| Through hole-heat cycle test (%) | | 2.5 | 5.7 |
| Insulation resistance value after pressure cooker treatment (Ω) | Normal state | $6 \times 10^{13}$ | — |
|  | 200 hours | $4 \times 10^{12}$ | |
|  | 500 hours | $5 \times 10^{11}$ | |
|  | 700 hours | $3 \times 10^{11}$ | |
|  | 1,000 hours | $9 \times 10^{10}$ | |
| Anti-migration properties (Ω) | Normal state | $5 \times 10^{13}$ | — |
|  | 200 hours | $4 \times 10^{12}$ | |
|  | 500 hours | $5 \times 10^{11}$ | |
|  | 700 hours | $3 \times 10^{11}$ | |
|  | 1,000 hours | $1 \times 10^{11}$ | |
| Processing time period for making holes (minute) | | 18 | 21 |

Example 8

A double-side copper-clad laminate having an insulating layer thickness of 400 μm was prepared in the same manner as in Example 1 except that the amount of a black pigment was changed to 8 parts. A coating composition prepared by dissolving a copper powder (average particle diameter: 0.8 μm) in a polyvinyl alcohol aqueous solution was applied to the surface of the above double-side copper-clad laminate to form a layer having a thickness of 60 μm, and the layer was dried to obtain a double-side copper-clad laminate P having a coating having a metal powder content of 10% by volume. A solution of a partially saponified water-soluble polyvinyl alcohol in water was applied on a 150 μm thick aluminum foil having a metal gloss, to form a layer having a thickness of 30 μm, and the layer was dried at 110° C. for 30 minutes to obtain a backup sheet. The backup sheet was laid down, the double-side copper-clad laminate P was placed thereon, and the backup sheet was bonded to the copper foil surface by passing a heating roll having a temperature equivalent to, or higher than, the melting point of the above partially saponified water-soluble polyvinyl alcohol. The coating surface was 7 pulses (shots) irradiated with a carbon dioxide gas laser at an output of 40 mJ/pulse to make 900 penetration holes having a diameter of 100 μm each for through holes at intervals of 300 μm in each of 70 blocks. The resin layer on the front surface was washed off with a hot water having a temperature of 60° C., and the backup sheet on the reverse surface was peeled off. Plasma treatment was carried out. Copper foil burrs around the holes were dissolved and removed, and the copper foil surface was dissolved until the copper foil had a thickness of 4 μm, by the SUEP method. Copper was plated on the resultant board by a conventional method to form a 15 μm thick plating layer (total thickness: 19 μm). Circuits (200, line/space=50/50 μm) were formed on the front surface, lands for solder balls, etc., were formed on the reverse surface, portions other than at least semiconductor chip portions, bonding pad portions and solder ball pad portions were coated with a plating resist, and nickel plating and gold plating were carried out to obtain a printed wiring board. Table 5 shows the evaluation results to the printed wiring board.

Example 9

A metal oxide powder (MgO 43 wt %, $SiO_2$ 57 wt %, average particle diameter 0.4 μm) was added to a resin aqueous solution containing polyvinyl alcohol and starch, these materials were uniformly stirred and mixed, and the mixture was applied to one surface of a 188 μm thick polyethylene terephthalate film to form a layer having a thickness of 25 μm. The layer was dried at 110° C. for 25 minutes to obtain a film-like hole-making auxiliary material Q having a metal oxide powder content of 90% by volume. Further, a solution of a partially saponified water-soluble polyvinyl alcohol in mixed solvents of water and methanol was applied on a matted surface of a 50 μm thick copper foil to form a layer having a thickness of 30 μm, and the layer was dried to obtain a resin-attached copper foil, which was to be used as a backup sheet. The backup sheet was laid down, the same four-layered copper-clad laminate as that prepared in Example 3 was placed thereon, the above auxiliary material Q was placed thereon so as to bring the resin layer containing the oxide metal powder into contact with the copper foil surface, and these backup sheet and the auxiliary material were bonded to the four-layered copper-clad laminate at a temperature higher than the melting points of the resins of the backup sheet and the auxiliary material at a linear pressure of 1.5 kgf. The auxiliary material surface was 9 pulses (shots) irradiated with a carbon dioxide gas laser at an output of 28 mJ/pulse to make penetration holes having a diameter of 80 μm each for through holes, and thereafter, the board was similarly processed to obtain a printed wiring board. Table 5 shows the evaluation results to the printed wiring board.

Example 10

Copper was deposited on both the surfaces of a polyimide film (trade name: Capton film, thickness 125 μm) to form copper layers having a thickness of 12 μm each. Two copper-deposited films prepared as above were stacked, the same backup sheet as that in Example 4 was laid down, the stacked films were placed thereon, and the same auxiliary sheet as that in Example 4 was placed thereon. The auxiliary sheet surface was 6 shots irradiated with a carbon dioxide gas laser at an output of 40 mJ/pulse to make penetration holes, and the hole walls were observed.

Comparative Example 9

Holes were made in the same double-side copper-clad laminate as that in Example 8 with a carbon dioxide gas laser in the same manner as in Example 8 with using a 1.6 mm thick stainless steel sheet having a surface gloss as a backup sheet. In this case, the penetration holes were partly cut off due to the partial reflection of laser beam which passed through the laminate. Further, copper foil around the holes was cut off due to the reflection, and the holes had an eccentric or deformed form. Further, stainless powders formed by the cutting adhered to the copper foil surface.

ductor chip portions, bonding pad portions and solder ball pad portions were coated with a plating resist, and nickel plating and gold plating were carried out, to obtain a printed wiring board. Table 6 shows the evaluation results to the printed wiring board.

Example 12

A partially saponified polyvinyl alcohol aqueous solution was applied to one surface of a 50 $\mu$m thick aluminum foil having a surface gloss, to form a layer having a thickness of 30 $\mu$m, and the layer was dried at 110° C. for 30 minutes to obtain a backup sheet. The backup sheet was laid down, and the same four-layered laminate as that prepared in Example 3 was placed thereon, and the same auxiliary material as the

TABLE 5

|  | Example | | | Comparative Example |
|---|---|---|---|---|
|  | 8 | 9 | 10 | 9 |
| Deviation of hole positions on the front and reverse surfaces ($\mu$m) | 0 | 0 | 0 | 0 |
| Form of hole | Circular | Circular | Circular | Circular in upper portion, deformed in lower portion |
| Internal wall surface of hole | Straight | Nearly straight | Nearly straight | Uneven to a great extent |
| Pattern breakage and short circuits (number of places) | 0/200 | 0/200 | — | 55/200 |
| Glass transition temperature (° C.) | 234 | 160 | — | 234 |
| Through hole-heat cycle test (%) | 2.0 | 5.6 | — | 8.0 |
| Processing time period for making holes (minute) | 21 | 26 | 10 | — |

Example 11

A double-side copper-clad laminate having an insulating layer thickness of 400 $\mu$m was prepared in the same manner as in Example 1 except that the amount of a black pigment was changed from 2 parts to 5 parts. A coating composition prepared by dissolving a copper powder (average particle diameter 0.9 $\mu$m) in a polyvinyl alcohol aqueous solution was applied to the surface of the copper-clad laminate to form a layer having a thickness of 60 $\mu$m, and the layer was dried to form a coating having a metal powder content of 10% by volume. The same backup sheet as that prepared in Example 8 was laid down, the above double-side copper-clad laminate having the resin layer was placed thereon, end portions thereof were fixed with an adhesive tape, and the resin layer was 7 pulses (shots) irradiated with a carbon dioxide gas laser at an output of 40 mJ/pulse to make 900 penetration holes having a diameter of 100 $\mu$m each at intervals of 300 $\mu$m in each of 70 blocks. The water-soluble resin layer was washed off with hot water having a temperature of 60° C., the backup sheet was removed, and plasma treatment was carried out. Copper foil burrs around the holes were dissolved and removed, and at the same time, the surface copper foil was dissolved until it had a thickness of 4 $\mu$m, by the SUEP method. Copper was plated on the board by a conventional method to form a layer having a thickness of 15 $\mu$m (total thickness: 19 $\mu$m) Circuits (200, line/space=50/50 $\mu$m) were formed on the surface, and lands for solder balls, etc., were formed on the reverse surface, by conventional methods. Portions other than at least semiconmaterial Q in Example 9 was placed thereon so as to bring the resin layer containing a metal oxide powder into contact with the copper foil surface. The backup sheet and the auxiliary material were bonded to the multi-layered board at a temperature higher than the melting points of the resins of the backup sheet and the auxiliary material, at a linear pressure of 15 kgf, and the auxiliary sheet was 9 pulse (shots) irradiated with a carbon dioxide gas laser at an output of 28 mJ/pulse, to make penetration holes having a diameter of 80 $\mu$m each for through holes. Thereafter, the board was similarly processed to obtain a printed wiring board. Table 6 shows the evaluation results to the printed wiring board.

TABLE 6

|  | Example | |
|---|---|---|
|  | 11 | 12 |
| Deviation of hole positions on the front and reverse surfaces ($\mu$m) | 0 | 0 |
| Form of hole | Circular | Circular |
| Internal wall surface of hole | Straight | Nearly straight |
| Pattern breakage and short circuits (number of places) | 0/200 | 0/200 |
| Glass transition temperature (° C.) | 234 | 160 |
| Through hole-heat cycle test (%) | 2.0 | 5.7 |

TABLE 6-continued

| | Example | |
|---|---|---|
| | 11 | 12 |
| Processing time period for making holes (minute) | 21 | 26 |

Example 13

A metal powder (stainless steel SUS 304, average particle diameter: 0.6 μm) was added to a resin aqueous solution containing polyvinyl alcohol and starch, and these materials were uniformly stirred and mixed. Then, the mixture was applied to a 100 μm thick polyethylene terephthalate film to form a layer having a thickness of 10 μm, and the layer was dried at 110° C. for 25 minutes to obtain a film-like auxiliary material S having a metal content of 95% by volume.

Separately, 700 parts of an epoxy resin (trade name: Epikote 5045), 300 parts of an epoxy resin (trade name: ESCN220F), 35 parts of dicyandiamide and 1 part of 2-ethyl-4-methylimidazole were dissolved in mixed solvents containing methyl ethyl ketone and dimethylformamide. Further, 800 parts of calcined talc (trade name: BST-#200) and 5 parts of a black pigment were added, and the mixture was forcibly stirred and uniformly dispersed to obtian a varnish T. A 100 μm thick glass woven fabric was impregnated with the varnish T to obtain prepregs (prepregs U) having a gelation time of 150 seconds and a glass fabric content of 55% by weight. Two prepregs U were stacked, 12 μm thick electrolytic copper foils were placed on the stacked prepregs U, one on one surface and the other on the other surface, and the resultant set was laminate-formed at 190° C. at 20 kgf/cm² under a vacuum of 30 mmHg or less for 2 hours, to obtain a double-side copper-clad laminate. The insulating layer had a thickness of 200 μm.

Two double-side copper-clad laminates obtained as above were stacked, the above auxiliary material S was placed thereon, and the auxiliary material S was 10 pulses irradiated with a carbon dioxide gas laser at an output of 30 mJ/pulse to make penetration holes having a diameter of 80 μm each for through holes.

The surfaces of the above double-side copper-clad laminates were processed by the SUEP method in the same manner as in Example 1 to obtain printed wiring boards. Table 7 shows the evaluation results to the printed wiring boards.

TABLE 7

| | Example 13 |
|---|---|
| Deviation of hole positions on the front and reverse surfaces (μm) | 0 |
| Form of hole | Circular |
| Internal wall surface of hole | Straight |
| Pattern breakage and short circuits (number of places) | 0/200 |
| Glass transition temperature (° C.) | 160 |
| Through hole-heat cycle test (%) | 3.9 |
| Processing time period for making holes (minute) | 15 |

Note: Both the board positioned above and the board positioned below had the same hole forms.

Example 14

Carbon (average particle diameter: 0.35 μm) was incorporated to a partially saponified polyvinyl alcohol to prepare a varnish V having a carbon content of 50% by volume. The varnish V was similarly applied to a 50 μm thick matted polyethylene terephthalate film and dried to obtain a hole-making auxiliary material W having a resin layer thickness of 37 μm.

Circuits were formed on the front and reverse surfaces of the same double-side copper-clad laminate as that in Example 1, the resultant board was treated to form black copper oxide, prepregs B were placed on the front and reverse surfaces, 12 μm thick electrolytic copper foils were placed thereon, and the resultant set was similarly laminate-formed to obtain a four-layered copper-clad laminate. The above hole-making auxiliary material W was placed on the front surface. Water was continuously sprayed in a mist form to the resin surface of the auxiliary material W to filtrate 2 μm deep in the surface, and the auxiliary material W was laminated and bonded to the copper foil surface at a linear pressure of 5 kgf at room temperature. The auxiliary material surface was 1 pulse irradiated with a carbon dioxide gas laser at an output of 40 mJ/pulse and 1 pulse irradiated at an output of 35 mJ/pulse, to make holes for via holes. Plasma treatment was carried out, then, copper plating was carried out, circuits were similarly formed on the front and reverse surfaces, and noble metal plating was carried out, to obtain a printed wiring board. Table 8 shows the evaluation results to the printed wiring boards.

TABLE 8

| | Example 14 |
|---|---|
| Deviation of hole positions on the front and reverse surfaces (μm) | 0 |
| Form of hole | Circular |
| Internal wall surface of hole | Straight |
| Pattern breakage and short circuits (number of places) | 0/200 |
| Chipping of copper foil around lands | No |
| Glass transition temperature (° C.) | 234 |
| Through hole-heat cycle test (%) | 2.8 |
| Processing time period for making holes (minute) | 13 |

What is claimed is:

1. An auxiliary material which is for use on a copper foil surface of a copper-clad laminate when a penetration hole is made in the copper-clad laminate with a carbon dioxide gas laser by irradiating the copper foil surface with an energy of 20 to 60 mJ/pulse sufficient by means of the pulse oscillation of a carbon dioxide gas laser, and which is a coating of a water-soluble resin composition containing 3 to 97% by volume of at least one powder selected from the group consisting of a metal compound powder, having a melting point of at least 900° C. and a bond energy of at least 300 KJ/mol, a carbon powder and metal powder.

2. The auxiliary material according to claim 1, wherein the sheet is a product formed by bonding a water-soluble resin composition to one surface of a thermoplastic film.

3. The auxiliary material according to claim 2, wherein the sheet is a product in which the total thickness of the layer of the water-soluble resin composition and the thermoplastic film is 30 to 200 μm.

4. The auxiliary material according to claim 2, wherein the sheet is used by disposing the layer of the water-soluble resin composition on the copper foil surface side and laminating the layer of the water-soluble resin composition to the copper foil under heat and pressure.

5. The auxiliary material according to claim 2, wherein the sheet is used by wetting the surface of the layer of the water-soluble resin composition 3 μm or less deep with water in advance, disposing the layer of the water-soluble resin composition on the copper foil surface side and laminating under pressure at room temperature.

6. A backup sheet for making a hole with a carbon dioxide gas laser, which is for use on a reverse outermost copper foil surface of a copper-clad laminate when a hole is made in the copper-clad laminate with a carbon dioxide gas laser by irradiating a front copper foil surface with an energy of 20 to 60 mJ/pulse by means of the pulse oscillation of a carbon dioxide gas laser and which comprises a 20 to 200 μm thick resin layer of a water-soluble resin composition and a metal plate.

* * * * *